United States Patent
Liang et al.

(10) Patent No.: US 11,680,337 B2
(45) Date of Patent: Jun. 20, 2023

(54) FABRICATION OF FILMS HAVING CONTROLLED STOICHIOMETRY USING MOLECULAR BEAM EPITAXY

(71) Applicant: Psiquantum, Corp., Palo Alto, CA (US)

(72) Inventors: Yong Liang, Niskayuna, NY (US); John Elliott Ortmann, Jr., Palo Alto, CA (US); John Berg, Palo Alto, CA (US); Ann Melnichuk, Rio Rancho, NM (US)

(73) Assignee: Psiquantum, Corp., Palo Alto, CA (US)

( * ) Notice: Subject to any disclaimer, the term of this patent is extended or adjusted under 35 U.S.C. 154(b) by 0 days.

(21) Appl. No.: 17/219,970

(22) Filed: Apr. 1, 2021

(65) Prior Publication Data
US 2021/0310152 A1    Oct. 7, 2021

Related U.S. Application Data

(60) Provisional application No. 63/004,933, filed on Apr. 3, 2020.

(51) Int. Cl.
*C30B 23/02* (2006.01)
*C30B 23/00* (2006.01)
(Continued)

(52) U.S. Cl.
CPC ............ *C30B 23/002* (2013.01); *C30B 23/02* (2013.01); *C30B 29/32* (2013.01); *G06T 7/001* (2013.01);
(Continued)

(58) Field of Classification Search
CPC ....... C30B 23/002; C30B 23/02; C30B 29/32; G06T 7/001; G06T 2207/20081;
(Continued)

(56) References Cited

U.S. PATENT DOCUMENTS

| | | | |
|---|---|---|---|
| 5,122,222 A * | 6/1992 | Turner | C30B 23/02 117/85 |
| 5,171,399 A | 12/1992 | Brennan et al. | |

(Continued)

FOREIGN PATENT DOCUMENTS

| | | | |
|---|---|---|---|
| EP | WO 0106538 | * | 1/2001 |
| JP | 63-502542 | * | 9/1988 |

(Continued)

OTHER PUBLICATIONS

PCT/US2021/025646, "International Search Report and Written Opinion", dated Jul. 27, 2021, 9 pages.

(Continued)

*Primary Examiner* — Robert M Kunemund
(74) *Attorney, Agent, or Firm* — Kilpatrick Townsend & Stockton LLP

(57) ABSTRACT

A method of forming a film comprises growing, using a deposition system, at least a portion of the film and analyzing, using a RHEED instrument, the at least a portion of the film. Using a computer, data is acquired from the RHEED instrument that is indicative of a stoichiometry of the at least a portion of the film. Using the computer, adjustments to one or more process parameters of the deposition system are calculated to control stoichiometry of the film during subsequent deposition. Using the computer, instructions are transmitted to the deposition system to execute the adjustments of the one or more process parameters. Using the deposition system, the one or more process parameters are adjusted.

20 Claims, 12 Drawing Sheets

(51) Int. Cl.
 *G06T 7/00* (2017.01)
 *C30B 29/32* (2006.01)
(52) U.S. Cl.
 CPC ............... *G06T 2207/20081* (2013.01); *G06T 2207/30108* (2013.01)
(58) Field of Classification Search
 CPC ........ G06T 2207/30108; C01P 2002/34; C01P 2002/74
 See application file for complete search history.

(56) References Cited

U.S. PATENT DOCUMENTS

| | | | |
|---|---|---|---|
| 5,238,525 A | | 8/1993 | Turner et al. |
| 5,588,995 A | | 12/1996 | Sheldon |
| 2003/0082833 A1 | * | 5/2003 | Yu .................... H01L 21/02513 |
| | | | 257/E21.12 |
| 2004/0097096 A1 | * | 5/2004 | Liang ................ H01L 21/02293 |
| | | | 438/785 |
| 2004/0164315 A1 | * | 8/2004 | Demkov ........... H01L 29/66939 |
| | | | 257/107 |
| 2012/0304918 A1 | | 12/2012 | Ichinose et al. |
| 2013/0333613 A1 | | 12/2013 | Einav |

FOREIGN PATENT DOCUMENTS

| | | | |
|---|---|---|---|
| JP | 4142127 | * | 6/2008 |
| JP | 5019247 | * | 9/2012 |

OTHER PUBLICATIONS

PCT/US2021/025646, "International Preliminary Report on Patentability", dated Oct. 13, 2022, 6 pages.

* cited by examiner

FABRICATION OF FILMS HAVING CONTROLLED STOICHIOMETRY USING MOLECULAR BEAM EPITAXY

CROSS-REFERENCES TO OTHER APPLICATIONS

This application claims priority to U.S. provisional patent application Ser. No. 63/004,933, for "FABRICATION OF BARIUM-TITANATE FILMS USING MOLECULAR BEAM EPITAXY" filed on Apr. 3, 2020 which is hereby incorporated by reference in entirety for all purposes.

FIELD

The described embodiments relate generally to methods of growing films in a molecular beam epitaxy (MBE) deposition system. More specifically, techniques disclosed herein relate to methods of forming films having a controlled stoichiometry in an MBE deposition system.

BACKGROUND

Currently there are numerous methods of growing epitaxial films on substrates, however new methods of growing films with accurately and autonomously controlled stoichiometry during the growth process are needed.

SUMMARY

In some embodiments a method of forming a film comprises growing, using a deposition system, at least a portion of the film and analyzing, using a RHEED instrument, the at least a portion of the film. Using a computer, data is acquired from the RHEED instrument that is indicative of a stoichiometry of the at least a portion of the film. Using the computer, adjustments to one or more process parameters of the deposition system are calculated to control stoichiometry of the film during subsequent deposition. Using the computer, instructions are transmitted to the deposition system to execute the adjustments of the one or more process parameters. Using the deposition system, the one or more process parameters are adjusted. In some embodiments the calculating comprises defining a first region of interest and a second region of interest in a RHEED image and calculating a ratio of an intensity of the first region of interest to an intensity of the second region of interest.

In various embodiments the calculating further comprises comparing the ratio to a threshold value. In some embodiments the calculating includes a machine learning algorithm that detects a change in stoichiometry of the at least a portion of the film. In various embodiments the data from the RHEED instrument comprises one or more electron diffraction patterns. In some embodiments the calculating comprises recording an intensity of a region of the one or more electron diffraction patterns during the growing of the at least a portion of the film and determining a period of oscillations in the intensity.

In some embodiments the calculating comprises recording an intensity of a region of the one or more electron diffraction patterns during the growing of at least a portion of the film and determining an amplitude of oscillations in the intensity. In various embodiments the film comprises barium, titanium and oxygen. In some embodiments the film comprises at least one of $BaTiO_3$, $(Ba, Sr)TiO_3$, $(Ba, Ca)TiO_3$, or $(Ba, Mg)TiO_3$. In various embodiments the data from the RHEED instrument comprises electron diffraction patterns from at least two different crystalline orientations.

In some embodiments a system for forming a film comprises a deposition system including one or more cells configured to deposit a film on a substrate using one or more process control parameters. A RHEED instrument is integrated with the deposition system and is configured to acquire images during the depositing that indicate a stoichiometry of a growth surface of the film. A computer is configured to analyze the images and transmit instructions to the deposition system to adjust at least one of the one or more process control parameters during the depositing.

In some embodiments the one or more process control parameters control the stoichiometry of the film. In various embodiments the analyzing comprises defining a first region of interest and a second region of interest in a RHEED image and calculating a ratio of an intensity of the first region of interest to an intensity of the second region of interest. In some embodiments the calculating further comprises comparing the ratio to a threshold value. In various embodiments the analyzing includes a machine learning algorithm that detects a change in stoichiometry during the depositing.

In some embodiments the computer determines a mean value of intensity within a region of interest defined within at least one of the images. In various embodiments the computer compares the mean value of intensity to a threshold value. In some embodiments the region of interest is defined to encompass at least a portion of a feature that increases in intensity in the images in response to a change in stoichiometry of the film. In various embodiments the film comprises barium, titanium and oxygen. In some embodiments the film comprises at least one of: strontium, titanium and oxygen; barium, strontium, titanium and oxygen; barium, magnesium, titanium and oxygen; or barium, calcium, titanium and oxygen.

Numerous benefits are achieved by way of the present invention over conventional techniques. For example, embodiments of the present invention provide the ability to automate and control the stoichiometry of a film during growth. The automation can improve the consistency of the stoichiometry and yield of the films over conventional methods.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Figure 1:
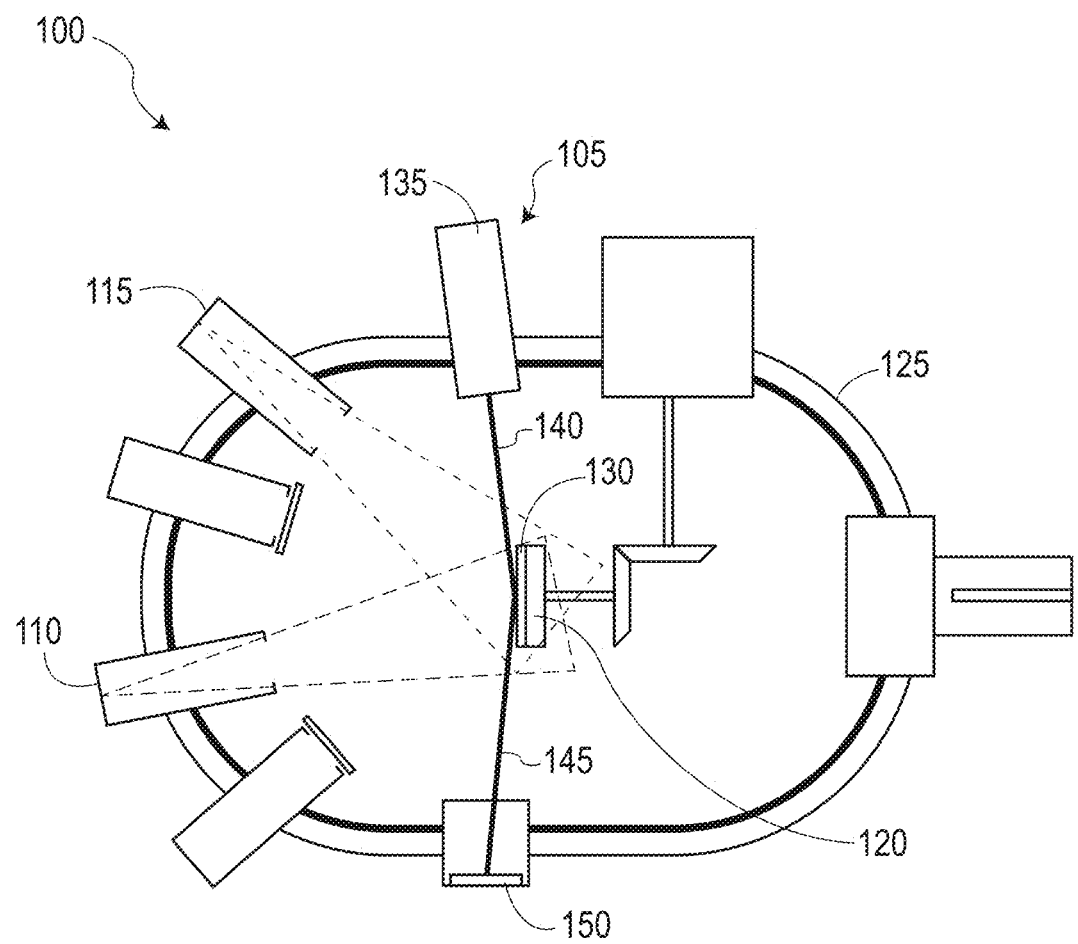
FIG. 1 is a simplified view of a MBE system that includes an in situ RHEED instrument, according to embodiments of the disclosure.

Techniques disclosed herein relate generally to methods of growing films in a molecular beam epitaxy (MBE) deposition system. More specifically, techniques disclosed herein relate to methods of forming films having a controlled stoichiometry in an MBE deposition system. Various inventive embodiments are described herein, including methods, processes, systems, devices, and the like.

For example, some embodiments relate to methods of forming a BTO film (where BTO is defined herein to include but is not limited to: $BaTiO_3$ and all permutations of $Ba_xTi_yO_z$) on substrates via MBE. In one embodiment the substrates comprise silicon and the BTO layer formed thereon is stoichiometric $BaTiO_3$ that is used to form an electro-optical switch. In some applications, such as a linear optical quantum computer, it may be desired to control the stoichiometry and quality of the BTO film within relatively stringent specifications.

In another example, an in situ Reflection High-Energy Electron Diffraction (RHEED) instrument is used to characterize the surface of the BTO film while it is grown on the substrate. The RHEED instrument can indicate the stoichiometry and quality of the growth surface of the BTO film via images of an electron diffraction pattern of the growth surface. As described in more detail herein, a closed-loop, real-time feedback system can be used to control the MBE system based on the output of the RHEED instrument. In some embodiments, changes in an intensity ratio between two regions of interest in the RHEED image can indicate changes in stoichiometry.

In further embodiments while growing an STO film, a region of interest in the corresponding RHEED images may be converted to grayscale and a mean intensity determined to indicate the change in stoichiometry of the STO film. When the mean intensity exceeds a threshold, adjustments can be made to the MBE system to correct the stoichiometry of the STO film. In further embodiments RHEED images can be used to train a machine learning algorithm to determine when the stoichiometry of a film exceeds allowable parameters and to adjust the MBE parameters accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates an example embodiment of a simplified MBE system 100 including an in situ RHEED instrument 105, according to embodiments of the disclosure. In this particular embodiment MBE system 100 includes a Ti Knudsen effusion cell 110 and a Ba Knudsen effusion cell 115 which each direct molecular beams at a substrate 120. MBE system 100 includes a chamber 125 that can be held at vacuum with a partial pressure of oxygen such that the Ba and Ti that impinge the substrate can form a BTO film 130 on substrate 120. As BTO film 130 is grown, RHEED instrument 105 can generate both qualitative and quantitative feedback regarding the quality of the growth surface of BTO film 130. More specifically a RHEED electron gun 135 emits an electron beam 140 that impinges BTO film 130 at an angle such that incident electrons diffract from atoms at the growth surface of the BTO film and a fraction of the diffracted electrons interfere constructively at specific angles to form electron diffraction patterns on CCD/detector 150. The molecular beams of Ba and Ti can be adjusted by changing a temperature of the respective Knudsen cells and/or by adjusting shutters that can be used to partially or fully block the molecular beams.

In some embodiments the stoichiometry and quality of the BTO film can be adjusted by varying one or more of the following parameters of the MBE system:

Changing a temperature of the Ba and/or Ti Knudsen effusion cells

Adjusting a shutter position of the Ba and/or Ti Knudsen effusion cells

Adjusting a temperature of the substrate

Adjusting a partial pressure of the oxygen in the chamber

Figure 2:
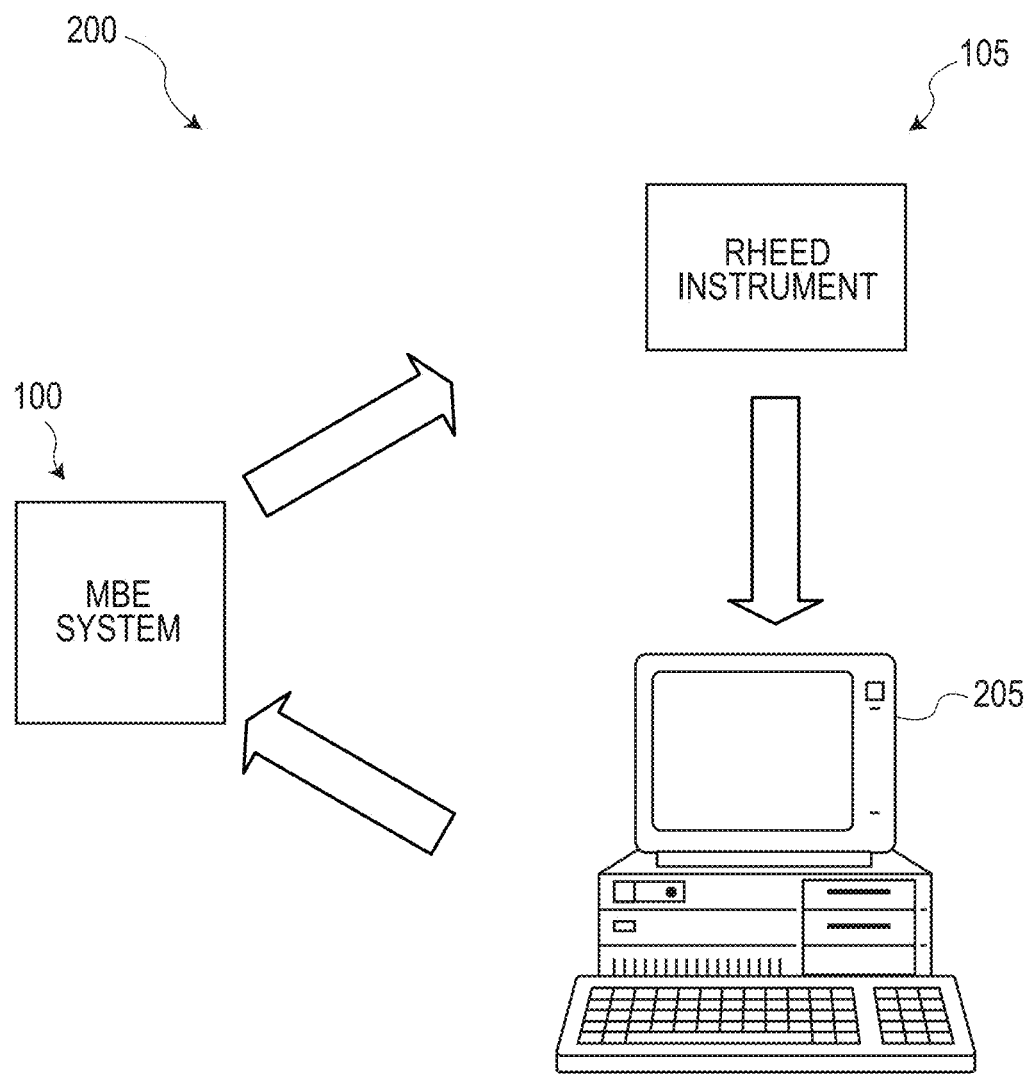
FIG. 2 is a simplified view of a closed-loop control system of the MBE system and the RHEED instrument shown in FIG. 1 coupled to a computer.

FIG. 2 illustrates a simplified block diagram of a closed-loop, real-time MBE control system 200 that includes in situ RHEED instrument 105 (see FIG. 1) coupled to an MBE system 100 and a computer system 205 for forming a closed-loop, real-time feedback system. As BTO film 130 (see FIG. 1) is grown in MBE chamber 125 the RHEED instrument can monitor the real-time stoichiometry and quality of the growth surface of the BTO film. In some embodiments RHEED instrument 105 outputs data via CCD/detector 150 (see FIG. 1), as described in more detail below. Computer 205 can be configured to analyze data generated by CCD/detector 150 (see FIG. 1). The results can be used to calculate adjustments that are required in MBE system 100 to maintain stoichiometric growth of BTO film 130 (see FIG. 1). Thus, RHEED instrument 105 and computer 205 work in conjunction with each other to continually adjust the parameters of MBE system 100 to maintain an optimized stoichiometry and quality of BTO film 130 (see FIG. 1) as it is grown, as described in more detail below.

Figure 3:
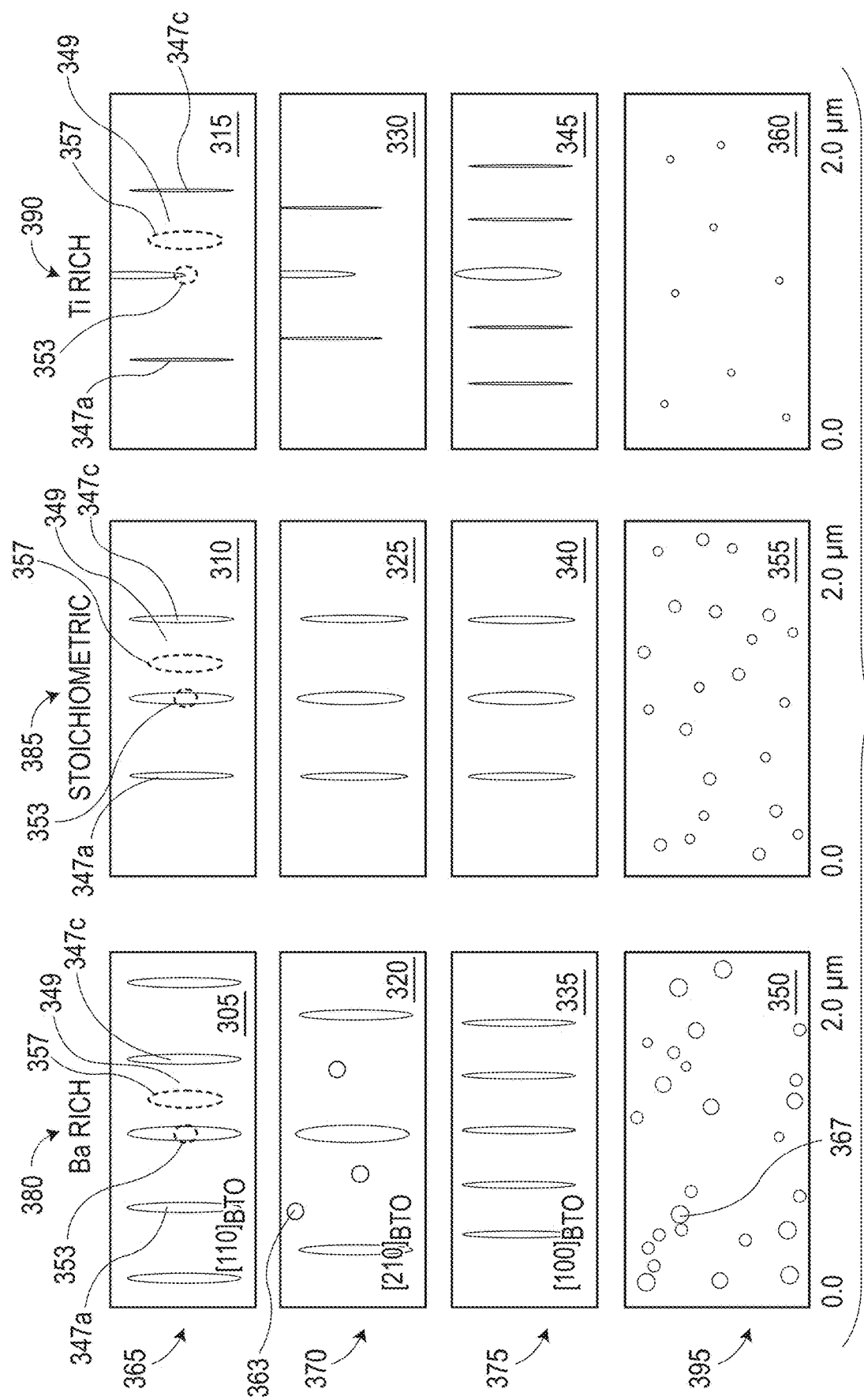
FIG. 3 is a series of RHEED images that can be analyzed by the computer shown in FIG. 2 to control the MBE system shown in FIGS. 1 and 2.

FIG. 3 illustrates example RHEED electron diffraction pattern models 305-345 that can be generated by CCD/detector 150 (see FIG. 1) of RHEED instrument 105 while analyzing BTO film 130, and comparative AFM measurements 350-360, according to embodiments of the disclosure. More specifically, RHEED models 305-345 are arranged such that columns 380, 385, 390 indicate example electron diffraction patterns captured by RHEED instrument 105 during growth of BTO films having different compositions and each row 365, 370, 375 is a different crystalline orientation of the BTO film. More specifically, row 365 corresponds to the [110] crystalline orientation, row 370 corresponds to the [210] crystalline orientation and row 375 corresponds to the [100] crystalline orientation. In other embodiments different crystalline orientations can be used.

Columns 380-390, indicate qualitative parameters of the stoichiometry of the growth surface of the BTO film. More specifically, column 380 corresponds to RHEED models that indicate a Ba rich condition for each of the crystalline orientations, column 385 corresponds to RHEED models that indicate a stoichiometric BTO film for each of the crystalline orientations (e.g., in this case a 1:1 ratio of Ba to Ti) and column 390 corresponds to RHEED models that indicate a Ti rich condition for each of the crystalline orientations. One method of determining the composition of the BTO film is to evaluate an intensity ratio of two regions of interest in the CCD/detector image (e.g., electron diffraction pattern), as described in more detail below.

Referring to column 385 that indicates a stoichiometric BTO film, model 310 is characterized by sequential vertical lines 347a-347c of relatively high intensity on a background 349 of relatively low intensity. A first region of interest 353 is positioned at a relative center of the brightest line 347b and a second region of interest 357 is positioned in background 349. One of ordinary skill in the art having the benefit of this disclosure would appreciate that other regions of interest could be used and are within the scope of this disclosure. An intensity ratio of first region of interest 353 to second region of interest 357 can be evaluated by computer 205 of FIG. 2 and tracked to determine the quality of the BTO film, as described in more detail below.

Referring to column 380 that indicates a Ba rich condition of the growth surface of the BTO film, generally, a Ba rich condition can be detected by a relative reduction in the intensity ratio. More specifically, in model 305 first region of interest 353 remains at a relatively high intensity and second region of interest 357 has an increased intensity, relative to model 310. Thus, the intensity ratio of model 305 has decreased relative to model 310. These changes indicate to computer system 205 (see FIG. 2) that the surface of the BTO film is Ba rich and the computer controls the MBE system 100 to adjust the growth conditions in the chamber accordingly.

More specifically, in response computer 205 may control MBE system 100 to perform one or more of the following actions: 1) decrease an opening of the Ba shutter, 2) decrease a temperature of the Ba Knudsen cell, 3) increase an opening of the Ti shutter, 4) increase a temperature of the Ti Knudsen cell or take other corrective actions. One of skill in the art having the benefit of this disclosure will understand the various modifications and other actions that can be taken to correct the Ba to Ti ratio. For example, computer 205 can use data from both an image and a plot to compare and determine if a particular parameter is out of control.

Similarly, referring to column 390 that indicates a Ti rich condition of the BTO film, generally, a Ti rich condition can be detected by a relative reduction in the intensity ratio and a relative reduction in the intensity of first region of interest 353 as compared to model 310. More specifically, as shown in model 315, first region of interest 353 has a significant reduction in intensity and second region of interest 357 has increased slightly in intensity, relative to model 310, thus the intensity ratio has decreased relative to model 310. These changes indicate to computer system 205 (see FIG. 2) that the surface of the BTO film is Ti rich and the computer controls MBE system 100 to adjust the growth conditions in the chamber accordingly.

More specifically, in response the computer may control MBE system 100 to perform one or more of the following actions: 1) increase an opening of the Ba shutter, 2) increase a temperature of the Ba Knudsen cell, 3) decrease an opening of the Ti shutter, 4) decrease a temperature of the Ti Knudsen cell or take other corrective actions. One of skill in the art with the benefit of this disclosure will understand the various modifications and other actions that can be taken to correct the Ba to Ti ratio and/or the oxygen ratio, such as, for example, adjusting a partial pressure of the oxygen in the chamber.

In some embodiments RHEED instrument 105 may be configured to generate RHEED electron diffraction pattern images corresponding to other crystalline orientations, as shown by the models in rows 370 corresponding to the [210] orientation and row 375 corresponding to the orientation. Any number and combination of crystalline orientations can be used by the computer system to determine the stoichiometric quality of the BTO film. For example, in some embodiments a [210] orientation may be used to determine if the film is Ba rich and a [100] orientation may be used to determine if the film is Ti rich. One of skill in the art having the benefit of this disclosure will appreciate the numerous combinations of orientations and images that can be used.

In some embodiments machine learning, training, artificial intelligence or other computer learning/training algorithms can be employed to enable computer 205 to recognize the quality and/or stoichiometry of the BTO film and make appropriate adjustments in the MBE system, if needed. As described herein, a machine learning algorithm is an application of artificial intelligence that provides systems the ability to automatically learn and improve from experience without being explicitly programmed. Typically, machine learning algorithms build a mathematical model based on sample data, often called "training data", to make predictions or decisions without being explicitly programmed to do so. Any suitable machine learning algorithm can be used including but not limited to: Linear Regression, Logistic Regression, Decision Tree, SVM, Naive Bayes, kNN, K-Means, Random Forest, Dimensionality Reduction Algorithms, Gradient Boosting algorithms, GBM, XGBoost, LightGBM and CatBoost.

Any of RHEED models 305-345 and/or actual RHEED images, can be used as training images for a machine learning algorithm to learn how to identify a Ba rich condition, a stoichiometric condition and a Ti rich condition.

For example, a machine learning algorithm could be programed to recognize the appearance of spots 363 in the Ba rich condition and a lack of contrast (e.g., less bright lines 347a-347c and brighter background 349 in image 315 vs image 310) in the Ti rich condition. In some embodiments atomic force microscopy images, 350, 355, 360 can be used to assist in identifying a Ba rich film surface that is evidenced by the formation of BaO islands 367. Other analytical tools including but not limited to secondary ion mass spectrometry, energy dispersive x-ray, etc. can be employed to determine the composition of the film and to assist in training the machine learning algorithm to detect changes in stoichiometry of the film. In further embodiments a "figure of merit" can be extracted and used to control the deposition system where the figure of merit can include, but is not limited to, a mean brightness, a standard deviation of brightness, a maximum and minimum brightness, or other metric. One of skill in the art having the benefit of this disclosure will appreciate that other suitable figures of merit can be used and are within the scope of this disclosure.

Figure 4A:
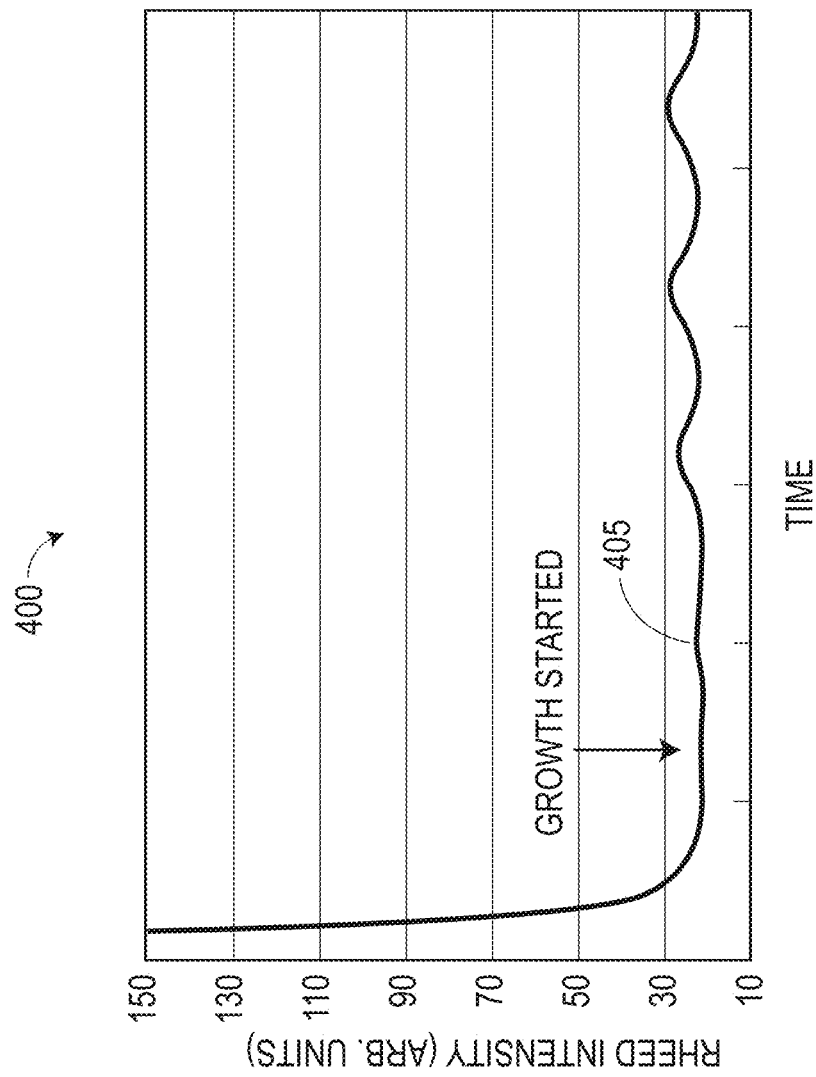
FIG. 4A is a graph of an intensity of a region in a series of RHEED images, according to embodiments of the disclosure.

FIG. 4A illustrates a graph 400 that can be generated from a series of consecutive images produced by the RHEED system that can be indicative of characteristics of the BTO film. More specifically, FIG. 4A plots intensity 405 of a selected region of interest on a series of RHEED images with respect to time. Graph 400 shows the initial growth of the film which is initiated at "Growth started" and continues in an oscillating pattern.

Figure 4B:
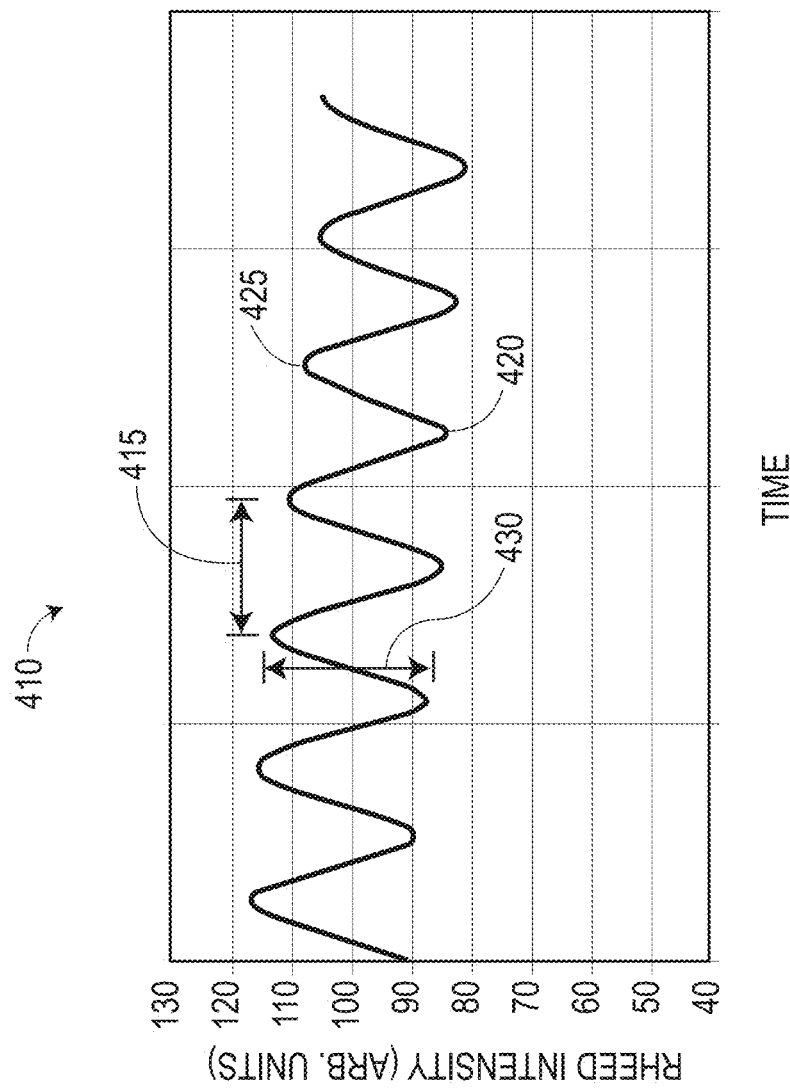
FIG. 4B is a graph of an intensity of a region in a series of RHEED images, according to embodiments of the disclosure.

FIG. 4B illustrates graph 410 that is a longer time period during a period of steady-state growth of the BTO film. A period 415 of the oscillations indicate a growth rate of the BTO film where one period is equal to deposition of one atomic layer. The periodicity is due to the changing structure of the surface of the BTO film where a valley 420 indicates that approximately one half an atomic layer of the BTO film has been formed and a peak 425 indicates that the growth of the atomic layer has been substantially completed.

The amplitude 430 is indicative of the film quality which can be related to stoichiometry. The signal that generates the aforementioned curves can be derived from the images shown in FIG. 3 by plotting the change in intensity of a particular region in a series of sequential RHEED images. In one embodiment the brightest region in a particular image is selected and the plots represent the relative change in intensity of that brightest region. Computer 205 (see FIG. 2) can also use any of the features of plots 405 and 410 shown in FIGS. 4A and 4B, respectively to determine a state of the BTO film and to make adjustments accordingly.

For example, if the computer determines that period 415 of the oscillating signal in FIG. 4B is outside of an allowable process window the computer can adjust the Ba and/or Ti flux to correct the film growth rate. If amplitude 430 of the signal decays rapidly the temperature of the substrate can be adjusted, the Ba to Ti ratio can be adjusted or the growth can be paused to recover surface crystallinity (which may or may not include an annealing step). One of skill in the art with the benefit of this disclosure will understand the various modifications and other actions that can be taken to correct the BTO quality and/or stoichiometry.

Figure 5A:
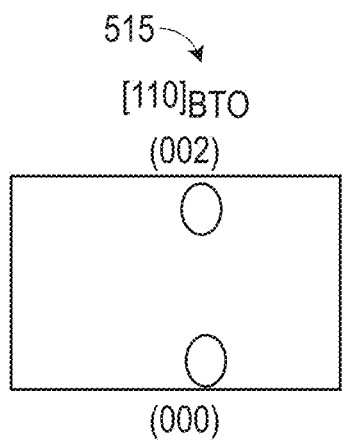
FIGS. 5A-5H are example RHEED electron scattering patterns of BTO, according to embodiments of the disclosure.
Figure 5B:
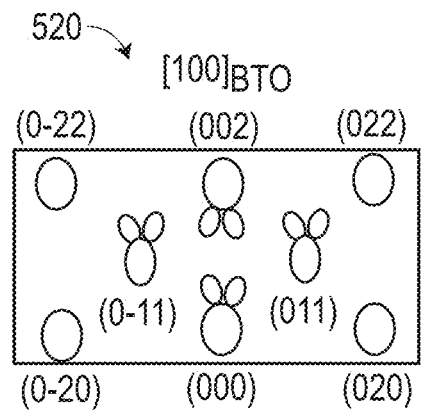
Figure 5C:
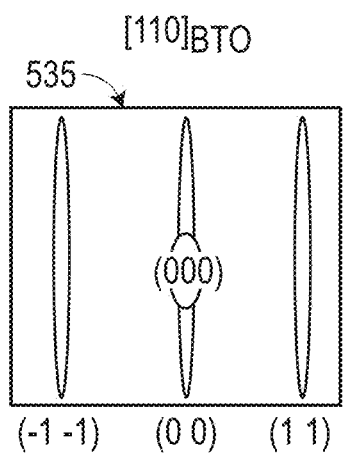
Figure 5D:
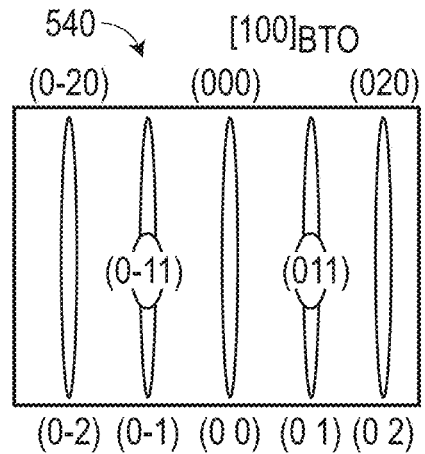
Figure 5E:
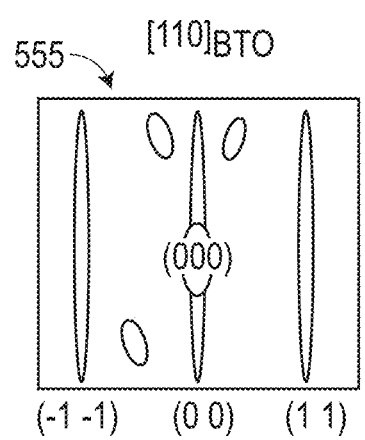
Figure 5F:
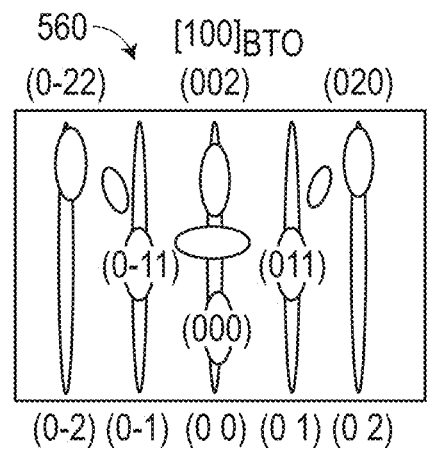
Figure 5G:
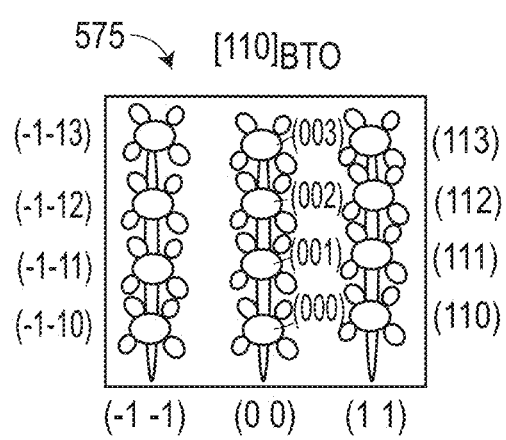
Figure 5H:
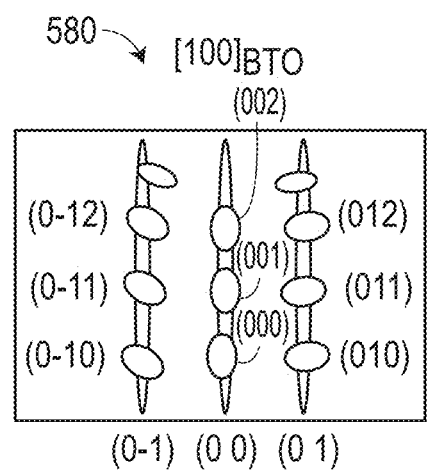

FIGS. 5A and 5B illustrate example RHEED electron diffraction pattern models 515, 520, respectively, of a stoichiometric BTO film in the [110] and [100] orientations, respectively. FIGS. 5C and 5D illustrate example RHEED electron diffraction pattern models 535, 540, respectively, of a BTO film in the [110] and [100] orientations, respectively. FIGS. 5E and 5F illustrate example RHEED electron diffraction pattern models 555, 560, respectively, of a stoichiometric BTO film in the [110] and [100] orientations, respectively. FIGS. 5G and 5H illustrate example RHEED electron diffraction pattern models 575, 580, respectively, of a stoichiometric BTO film in the [110] and [100] orientations, respectively.

One of skill in the art having the benefit of this disclosure will appreciate that the methods described above for controlling the stoichiometry of the BTO film are not limited to BTO and can be used to control the composition of any type of film.

Figure 6A:
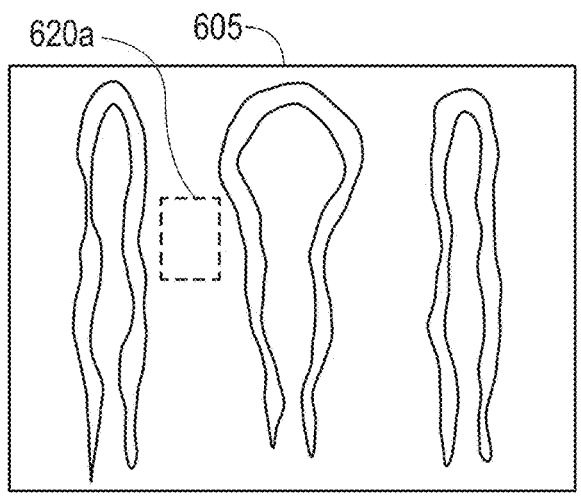
FIG. 6A is a RHEED image of a stoichiometric STO film including a region of interest positioned between two features of the image, according to embodiments of the disclosure.
Figure 6B:
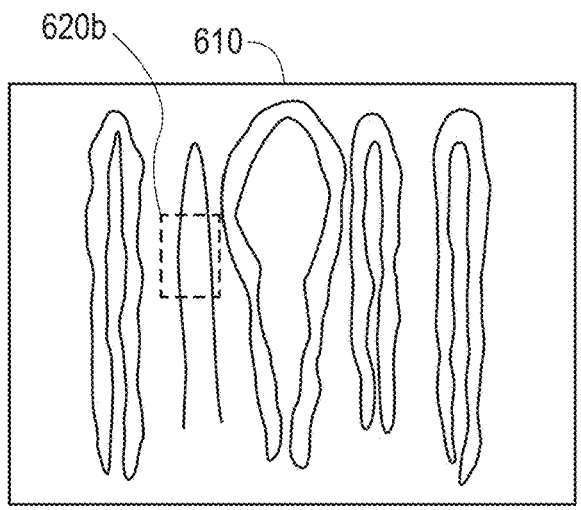
FIG. 6B is a RHEED image of a STO film that is shifted from a stoichiometric composition and includes the region of interest positioned at a same location as shown in FIG. 6A, according to embodiments of the disclosure.
Figure 6C:
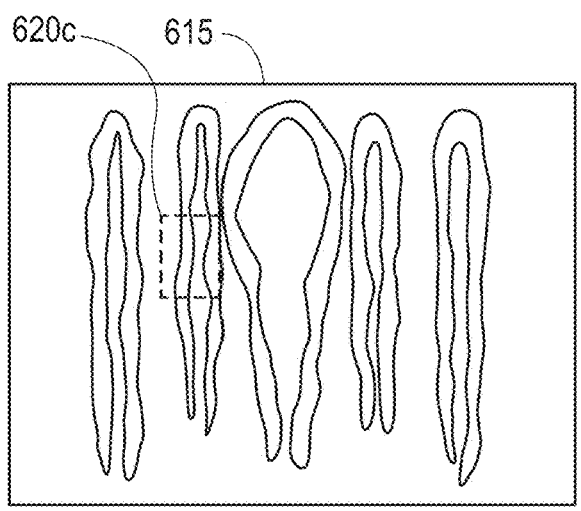
FIG. 6C is a RHEED image of a STO film that is significantly shifted from a stoichiometric composition and includes the region of interest positioned at a same location as shown in FIGS. 6A and 6B, according to embodiments of the disclosure.
Figure 6D:
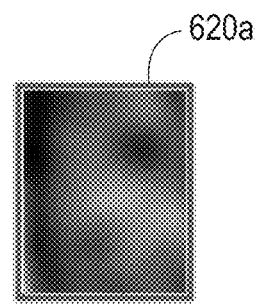
FIG. 6D is the region of interest from FIG. 6A.
Figure 6E:
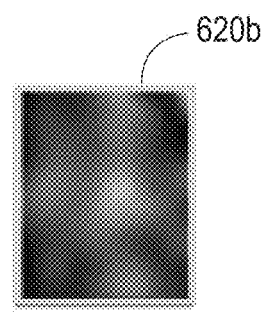
FIG. 6E is the region of interest from FIG. 6B.
Figure 6F:
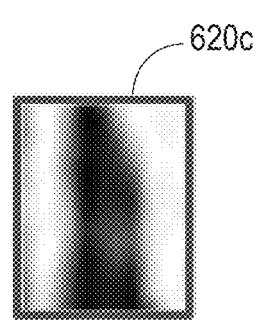
FIG. 6F is the region of interest from FIG. 6C.

FIGS. 6A-6C illustrate representative RHEED electron diffraction pattern images of a strontium titanate (STO) film, that can be fabricated using an MBE system that is similar to that illustrated in FIGS. 1 and 2, according to embodiments of the disclosure. FIG. 6A illustrates a RHEED image 605 of a stoichiometric STO film. FIG. 6B illustrates a RHEED image 610 of a STO film where the stoichiometry is shifting and FIG. 6C illustrates a RHEED image 615 of a STO film with a substantial change in stoichiometry. As used herein, STO includes but is not limited to: $SrTiO_3$ and all permutations of $Sr_xTi_yO_z$. As described above, one or more regions of interest can be defined within the RHEED image that indicate changes in stoichiometry of the film. In this embodiment, a region of interest 620a, 620b, 620c is positioned within each image 605, 610, 615 of FIGS. 6A, 6B, 6C, respectively. More specifically, region of interest 620a for RHEED image 605 (see FIG. 6A) is shown in FIG. 6D, region of interest 620b for RHEED image 610 (see FIG. 6B) is shown in FIG. 6E and region of interest 620c for RHEED image 615 (see FIC. 6C) is shown in FIG. 6F. Thus, a similar methodology as described above using a change of a region of interest in sequential RHEED images can be used to control the quality of a STO film formed in an MBE system.

In some embodiments continuous RHEED imaging of the growing film may damage the film so the RHEED system may be adjusted to periodically acquire a new RHEED image, (e.g., 30 seconds of data collection every 5 minutes, every 50 minutes, etc.). In further embodiments a sample manipulator within the MBE system may sequentially orient itself such that RHEED images at the selected crystalline orientations can be recorded (e.g., [100], [110], etc.). In further embodiments the RHEED system may run continuously while the sample manipulator rotates and the system can extract RHEED images when the sample is aligned at the appropriate crystalline orientation.

Figure 7:
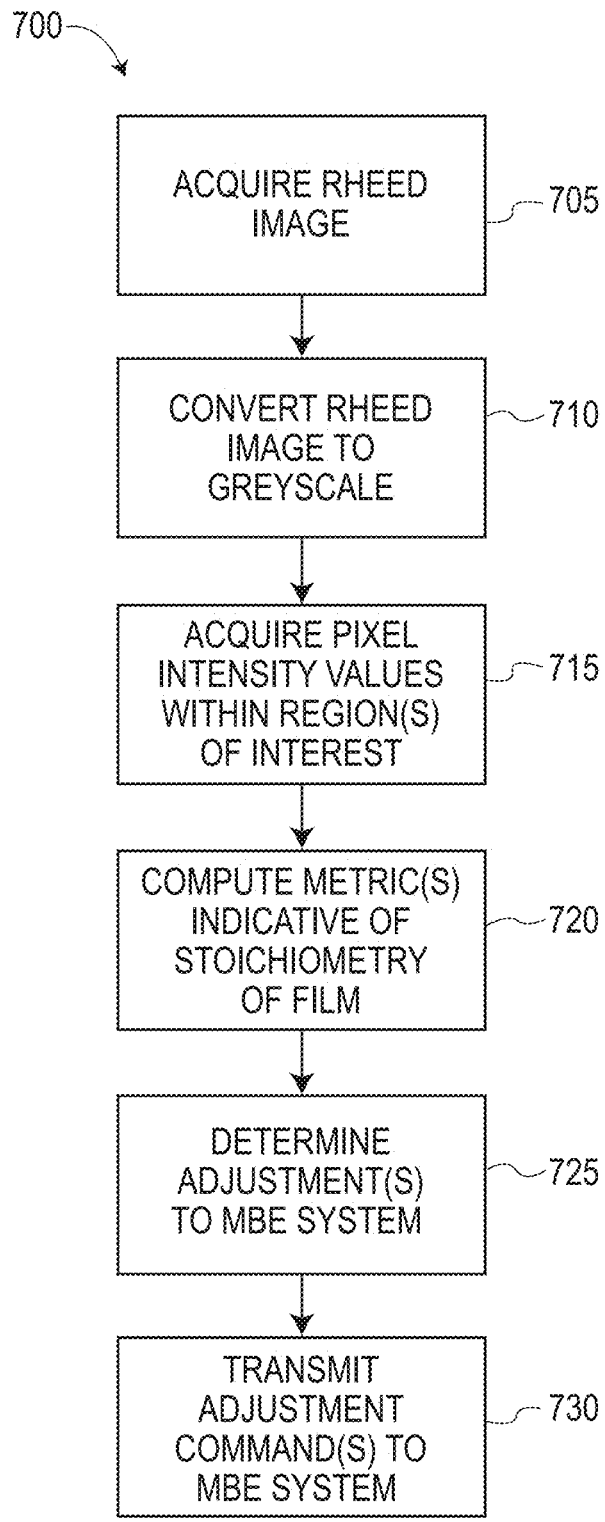
FIG. 7 is a method of controlling the stoichiometry of a film formed in a MBE chamber, according to embodiments of the disclosure.
Figure 8:
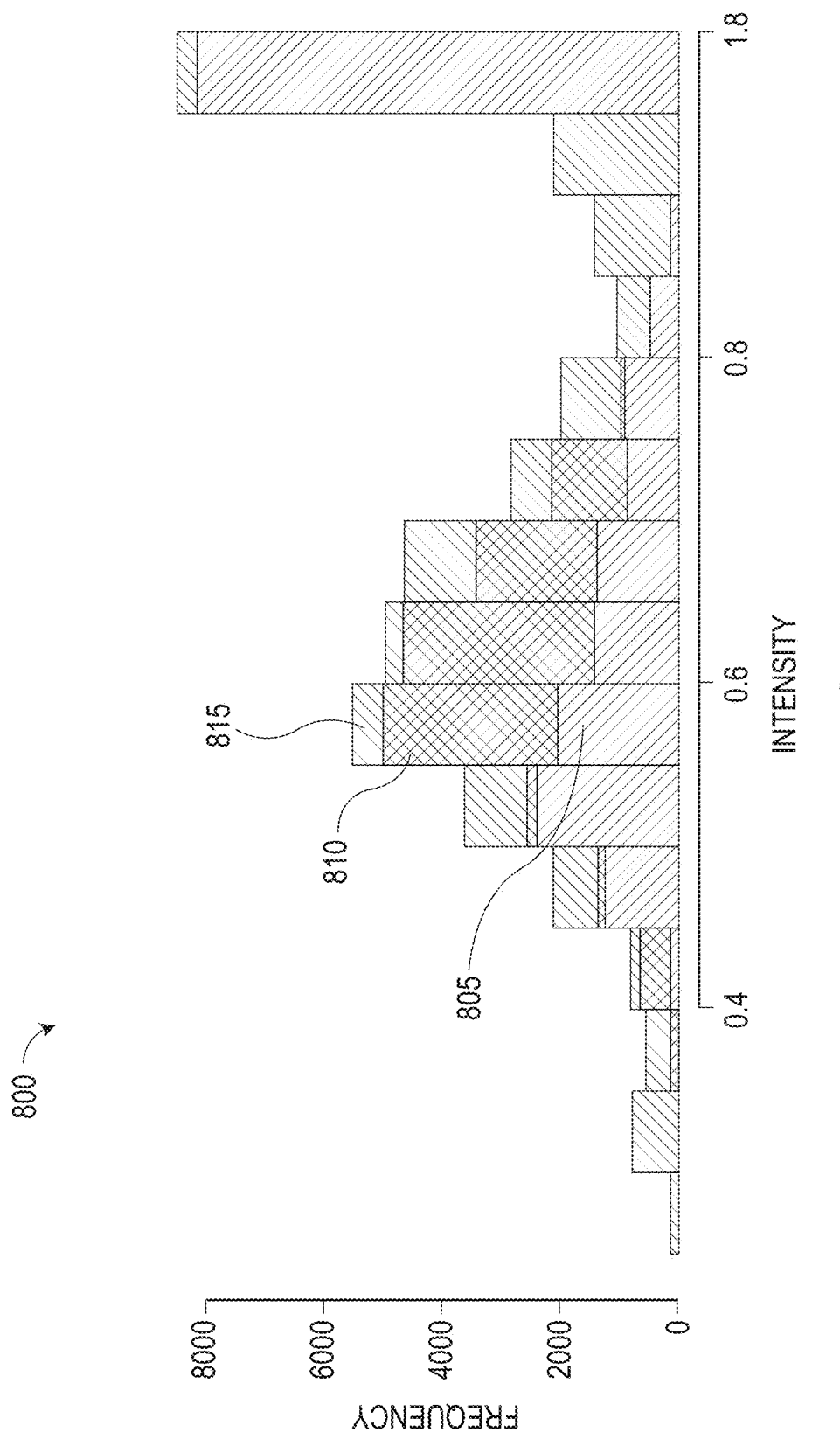
FIG. 8 is a histogram analysis of the intensity of the regions of interest shown in FIGS. 6D-F.
Figure 9:
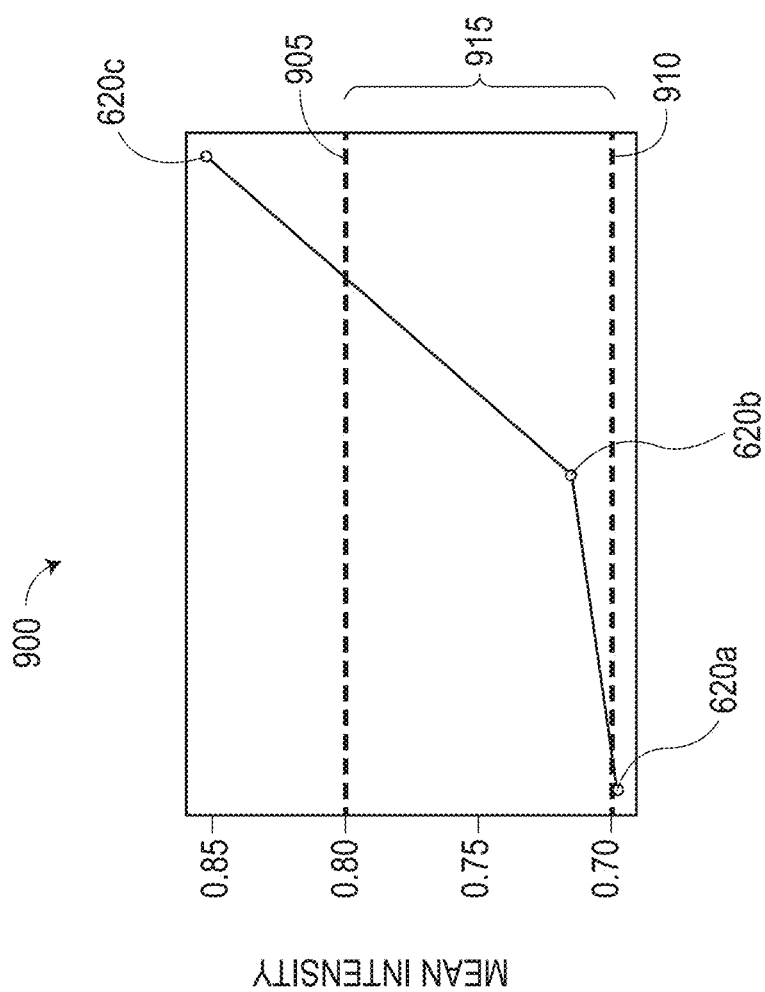
FIG. 9 is a graph of the mean intensity of the regions of interest shown in FIGS. 6D-F.

FIG. 7 illustrates steps associated with a method 700 of controlling the stoichiometry of a film formed in an MBE chamber, according to embodiments of the disclosure. FIGS. 8 and 9 illustrate an example method of using images from a RHEED system to control the MBE system according to method 700 described in FIG. 7. As described in FIGS. 3, 5A-5P, and 6A-6F a RHEED image of a film that is being formed in an MBE chamber is generated by a RHEED system. In step 705, the RHEED image is acquired by a computing system, such as, for example, computing system 205 in FIG. 2 or computing system 1000 in FIG. 10.

In some embodiments the RHEED image is generated using a CCD/detector that is part of the RHEED system and the values of each pixel defined within the CCD/detector are transferred to the computing system. In some embodiments the CCD/detector can be calibrated such that all pixels have a common basis for reporting intensity values. In further embodiments a saturation level of the CCD/detector may be adjusted so all readings are within a dynamic range of the sensor. In further embodiments calibration and/or saturation adjustments may be performed at different crystalline angles (e.g., orientations [100] and [110]) and at the beginning and the end of the growth of a layer of the film to ensure accuracy and resolution of the image.

In step 710, the RHEED image is converted to greyscale, that is, to an array of pixels with each pixel having a single value that describes its relative intensity. In some embodiments the RHEED system can perform this conversion and may transfer the greyscale values to the computing system while in other embodiments this can be performed in the computing system after receiving the RHEED image. As appreciated by one of skill in the art having the benefit of this disclosure other suitable values for each pixel can also be used such as, but not limited to voltages, color values, etc.

In step 715 the computing system extracts greyscale pixel values for region(s) of interest. That is, as described in FIGS. 3 and 6A-6F one or more regions of interest can be defined within each sequential RHEED image. In some embodiment the region(s) of interest are defined using a coordinate system within the RHEED image (e.g., using the pixel grid) however in other embodiments the image can be adjusted to compensate for shifting such that the area of interest is in the same graphical region, regardless of whether the image generally shifts. As an example, the region of interest 620 shown in FIGS. 6A-6C is a rectangle defined between two features in the RHEED image.

In step 720 metric(s) indicative of the stoichiometry of the film are computed. One example of this is shown in FIG. 8 in which a histogram summary 800 of the intensity values within the area of interest are computed for regions of interest 620a, 620b, 620c illustrated in FIGS. 6D, 6E and 6F, respectively. As shown in FIG. 8 histogram 805, which is associated with area of interest 620a of FIG. 6D (a stoichiometric condition), indicates a relatively bell-shaped intensity centered around 0.6. As the stoichiometry shifts as shown in FIG. 6B, the histogram shifts due to the increased intensity with the region of interest. This is shown by histogram 810, which is associated with region of interest 620b of FIG. 6E. As the stoichiometry shifts further as shown in FIG. 6C, the intensity within the region of interest is significantly shifted higher, shown in histogram 815 which is associated with region of interest 620c of FIG. 6F. In some embodiments the metric indicative of the stoichiometry can be a parameter of the histogram, a mean intensity of the region of interest or any other suitable parameter. In this particular embodiment the mean intensity will be used for example purposes only.

FIG. 9 is a summary of the mean intensities associated with areas of interest 620a, 620b, 620c, of FIGS. 6D, 6E, 6F, respectively. As shown in FIG. 9, area of interest 620a of FIG. 6D indicates a high degree of stoichiometry and demonstrates a mean intensity of approximately 0.69. Area of interest 620b of FIG. 6E indicates a shift in stoichiometry and demonstrates a mean intensity of approximately 0.72. Area of interest 620c of FIG. 6E indicates a greater shift in stoichiometry and demonstrates a mean intensity ratio of approximately 0.85. Depending on how tightly the stoichiometry is to be controlled a threshold mean intensity value can be defined (e.g. 0.7) as shown in FIG. 9 and whenever the mean intensity rises above that threshold, method 700 can proceed to step 725.

In step 725 the computing system can determine adjustment(s) to be made to the MBE system. In some embodiments a magnitude of the amount the mean intensity is greater than the threshold level can change a magnitude and/or combination of the adjustments made to the MBE system. In various embodiments a slope of the change in mean intensity from one or more prior readings may be used to determine the magnitude of the adjustments to the MBE system. In further embodiments multiple variables such as the change in mean intensity of a region of interest, a ratio of intensities within at least two areas of interest and a change in at least one intensity over time can be used to determine one or more adjustments to be made to the MBE system. As further shown in FIG. 9 there may be a critical intensity (e.g., 0.8 in FIG. 9) above which the system shuts down as the quality of the film is too poor to continue growing, or an annealing step or other process may be performed before growth is resumed.

One of skill in the art having the benefit of this disclosure will appreciate that numerous areas of interest can be defined, that any combination of crystalline orientations can be used and that myriad algorithms can be used to monitor and correct the stoichiometry of the film. Further, although BTO and STO films are described herein, this disclosure is not limited to these films nor to an MBE chamber and the methods described herein can be used to grow any suitable film in any appropriate system. For example, alloys of BTO with other perovskite oxides such as STO that results in $Ba_{1-y}Sr_yTi_3$, or $(Ba,Sr)TiO_3$, is among known ferroelectrics and can be grown using the same method.

It will be appreciated that method 700 is illustrative and that variations and modifications are possible. Steps described as sequential may be executed in parallel, order of steps may be varied, and steps may be modified, combined, added or omitted. Although changes in an intensity ratio were used to control the stoichiometry of a BTO film and a mean intensity was used to control the stoichiometry of an STO film, these methods can be used to control the stoichiometry of any film.

Figure 10:
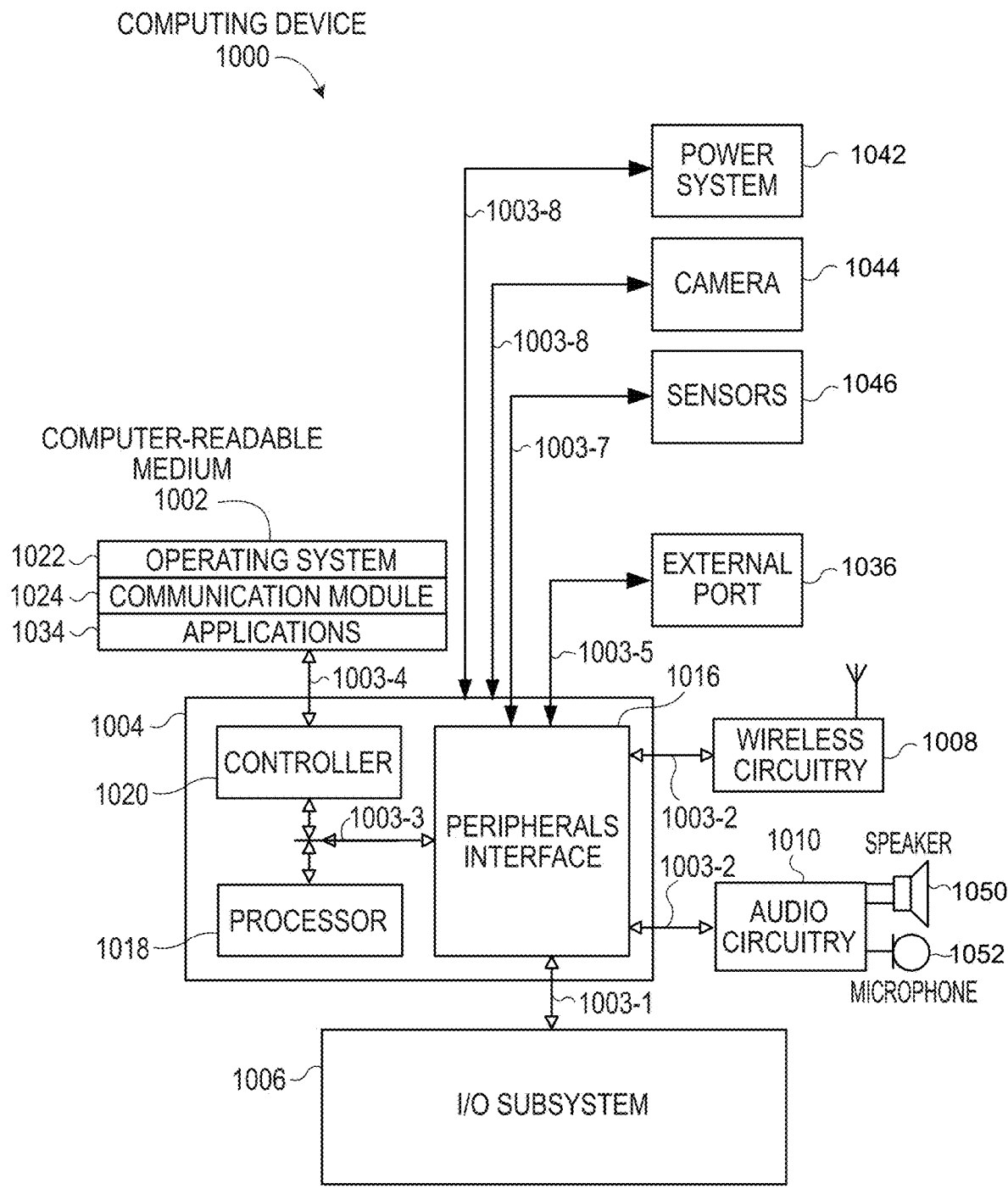
FIG. 10 is an example computer that can be coupled to the MBE system and RHEED instruments shown in FIGS. 1 and 2.

FIG. 10 is a block diagram of an example computing device 1000. Device 1000 generally includes computer-readable medium 1002, control circuitry 1004, an Input/Output (I/O) subsystem 1006, wireless circuitry 1008, and audio circuitry 1010 including speaker 1050 and microphone 1052. These components may be coupled by one or more communication buses or signal lines 1003. Device 1000 can be any computing device, including a handheld computer, a tablet computer, laptop computer, tablet device, a smart phone, or the like, including a combination of two or more of these items.

It should be apparent that the architecture shown in FIG. 10 is only one example of an architecture for device 1000, and that device 1000 can have more or fewer components than shown, or a different configuration of components. The various components shown in FIG. 10 can be implemented in hardware, software, or a combination of both hardware and software, including one or more signal processing and/or application specific integrated circuits.

Wireless circuitry 1008 is used to send and receive information over a wireless link or network to one or more other devices' conventional circuitry such as an antenna system, a radio frequency (RF) transceiver, one or more amplifiers, a tuner, one or more oscillators, a digital signal processor, a CODEC chipset, memory, etc. Wireless circuitry 1008 can use various protocols, e.g., as described herein. In various embodiments, wireless circuitry 1008 is capable of establishing and maintaining communications with other devices using one or more communication protocols, including time division multiple access (TDMA), code division multiple access (CDMA), global system for mobile communications (GSM), Enhanced Data GSM Environment (EDGE), wideband code division multiple access (W-CDMA), Long Term Evolution (LTE), Long-term Evolution (LTE)-Advanced, Wi-Fi (such as Institute of Electrical and Electronics Engineers (IEEE) 802.11a, IEEE 802.11b, IEEE 802.11g and/or IEEE 802.11n), Bluetooth, Wi-MAX, voice over Internet Protocol (VoIP), near field communication protocol (NFC), a protocol for email, instant messaging, and/or a short message service (SMS), or any other suitable communication protocol, including communication protocols not yet developed as of the filing date of this document.

Wireless circuitry 1008 is coupled to control circuitry 1004 via peripherals interface 1016. Voice and data information received by wireless circuitry 1008 (e.g., in speech recognition or voice command applications) is sent to one or more processors 1018 via peripherals interface 1016. One or more processors 1018 are configurable to process various data formats for one or more application programs 1034 stored on medium 1002.

Peripherals interface 1016 couple the input and output peripherals of device 1000 to the one or more processors 1018 and computer-readable medium 1002. One or more processors 1018 communicate with computer-readable medium 1002 via a controller 1020. Computer-readable medium 1002 can be any device or medium that can store code and/or data for use by one or more processors 1018. Computer-readable medium 1002 can include a memory hierarchy, including cache, main memory, and secondary memory. The memory hierarchy can be implemented using any combination of RAM (e.g., Standard Random Access Memory (SRAM), Dynamic Random Access Memory (DRAM), Double Data Random Access Memory (DDRAM), Read only Memory (ROM), FLASH, magnetic and/or optical storage devices, such as disk drives, magnetic tape, CDs (compact disks) and DVDs (digital video discs). In some embodiments, peripherals interface 1016, one or more processors 1018, and controller 1020 can be implemented on a single chip, such as control circuitry 1004. In some other embodiments, they can be implemented on separate chips.

Processor(s) 1018 can include hardware and/or software elements that perform one or more processing functions, such as mathematical operations, logical operations, data manipulation operations, data transfer operations, controlling the reception of user input, controlling output of information to users, or the like. Processor(s) 1018 can be embodied as one or more hardware processors, microprocessors, microcontrollers; field programmable gate arrays (FPGAs), application-specified integrated circuits (ASICs), or the like.

Device 1000 may include storage and processing circuitry such as control circuitry 1004. Control circuitry 1004 may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 1004 may be used to control the operation of device 1000. This processing circuitry may be based on one or more microprocessors, microcontrollers, digital signal processors, baseband processor integrated circuits, application specific integrated circuits, etc.

Control circuitry 1004 may be used to run software on device 1000, such as RHEED image analysis, computations, MBE parameter adjustment computations, internet browsing applications, voice-over-internet-protocol (VOIP) telephone call applications, email applications, media playback applications, operating system functions, etc. To support interactions with external equipment, control circuitry 1004 may be used in implementing communications protocols. Communications protocols that may be implemented using control circuitry 1004 include internet protocols, wireless local area network protocols (e.g., IEEE 802.11 protocols—sometimes referred to as Wi-Fi®), protocols for other short-range wireless communications links such as the Bluetooth® protocol, cellular telephone protocols, multiple-input and multiple-output (MIMO) protocols, antenna diversity protocols, satellite navigation system protocols, millimeter wave communications protocols, IEEE 802.15.4 ultra-wideband communications protocols, etc.

Device 1000 may include input-output circuitry 1006. Input-output circuitry 1006 may include input-output devices. Input-output devices may be used to allow data to be supplied to device 1000 and to allow data to be provided from device 1000 to external devices (e.g., MBE system 100, RHEED instrument 105). Input-output devices may include user interface devices, data port devices, and other input-output components. For example, input-output devices may include one or more displays (e.g., touch screens or displays without touch sensor capabilities), one or more image sensors 1044 (e.g., digital image sensors), motion sensors, and speakers 1050. Input-output device may also include buttons, joysticks, scrolling wheels, touch pads, keypads, keyboards, microphones 1052, haptic elements such as vibrators and actuators, status indicators, light sources, audio jacks and other audio port components, digital data port devices, light sensors, capacitance sensors, proximity sensors (e.g., a capacitive proximity sensor and/or an infrared proximity sensor), magnetic sensors, and other sensors and input-output components.

Device 1000 also includes a power system 1042 for powering the various hardware components. Power system 1042 can include a power management system, one or more power sources (e.g., battery, alternating current (AC)), a recharging system, a power failure detection circuit, a power converter or inverter, a power status indicator (e.g., a light emitting diode (LED)) and any other components typically associated with the generation, management and distribution of power in mobile devices.

In some embodiments, device 1000 includes an image sensor 1044 (e.g., a camera). In some embodiments, device 1000 includes sensors 1046. Sensors can include accelerometers, compass, gyrometer, pressure sensors, audio sensors, light sensors, barometers, and the like. Sensors 1046 can be used to sense location aspects, such as auditory or light signatures of a location.

One or more processors 1018 run various software components stored in medium 1002 to perform various functions for device 1000. In some embodiments, the software components include an operating system 1022, a communication module 1024 (or set of instructions), a location module 1026 (or set of instructions), a ranging module 1028 that is used as part of ranging operation described herein, and other application programs 1034 (or set of instructions).

Operating system 1022 can be any suitable operating system, including iOS, Mac OS, Darwin, Quatros Real-Time Operating System (RTXC), LINUX, UNIX, OS X, WINDOWS, or an embedded operating system such as VxWorks. The operating system can include various procedures, sets of instructions, software components, and/or drivers for controlling and managing general system tasks (e.g., memory management, storage device control, power management, etc.) and facilitates communication between various hardware and software components.

Communication module 1024 facilitates communication with other devices over one or more external ports 1036 or via wireless circuitry 1008 and includes various software components for handling data received from wireless circuitry 1008 and/or external port 1036. External port 1036

(e.g., universal serial bus (USB), FireWire, Lightning connector, 60-pin connector, etc.) is adapted for coupling directly to other devices or indirectly over a network (e.g., the Internet, wireless LAN, etc.).

Dielectric-filled openings such as plastic-filled openings may be formed in metal portions of housing such as in metal sidewall structures (e.g., to serve as antenna windows and/or to serve as gaps that separate portions of antennas from each other).

Antennas may be mounted in housing. If desired, some of the antennas (e.g., antenna arrays that may implement beam steering, etc.) may be mounted under dielectric portions of device 1000 (e.g., portions of the display cover layer, portions of a plastic antenna window in a metal housing sidewall portion of housing, etc.). With one illustrative configuration, some or all of rear face of device 1000 may be formed from a dielectric. For example, the rear wall of housing may be formed from glass plastic, ceramic, other dielectric. In this type of arrangement, antennas may be mounted within the interior of device 1000 in a location that allows the antennas to transmit and receive antenna signals through the rear wall of device 1000 (and, if desired, through optional dielectric sidewall portions in housing). Antennas may also be formed from metal sidewall structures in housing and may be located in peripheral portions of device 1000.

Antennas in device 1000 may include cellular telephone antennas, wireless local area network antennas (e.g., Wi-Fi® antennas at 2.4 GHz and 5 GHz and other suitable wireless local area network antennas), satellite navigation system signals, and near-field communications antennas. The antennas may also include antennas that support IEEE 802.15.4 ultra-wideband communications protocols and/or antennas for handling millimeter wave communications. For example, the antennas may include two or more ultra-wideband frequency antennas and/or millimeter wave phased antenna arrays. Millimeter wave communications, which are sometimes referred to as extremely high frequency (EHF) communications, involve signals at 60 GHz or other frequencies between about 10 GHz and 400 GHz.

Wireless circuitry in device 1000 may support communications using the IEEE 802.15.4 ultra-wideband protocol. In an IEEE 802.15.4 system, a pair of devices may exchange wireless time stamped messages. Time stamps in the messages may be analyzed to determine the time of flight of the messages and thereby determine the distance (range) between the devices.

Image sensors 1044 may include one or more visible digital image sensors (visible-light cameras) and/or one or more infrared digital image sensors (infrared-light cameras). Image sensors 1044 may, if desired, be used to measure distances. For example, an infrared time-of-flight image sensor may be used to measure the time that it takes for an infrared light pulse to reflect back from objects in the vicinity of device 1000, which may in turn be used to determine the distance to those objects. Visible imaging systems such as a front and/or rear-facing camera in device 1000 may also be used to determine the position of objects in the environment. For example, control circuitry 1004 may use image sensors 1044 to perform simultaneous localization and mapping (SLAM). SLAM refers to the process of using images to determine the position of objections in the environment while also constructing a representation of the imaged environment. Visual SLAM techniques include detecting and tracking certain features in images such as edges, textures, room corners, window corners, door corners, faces, sidewalk edges, street edges, building edges, tree trunks, and other prominent features. Control circuitry 1004 may rely entirely upon image sensors 1044 to perform simultaneous localization and mapping, or control circuitry 1004 may synthesize image data with range data from one or more distance sensors (e.g., light-based proximity sensors). If desired, control circuitry 1004 may use display to display a visual representation of the mapped environment.

Input-output devices may include motion sensor circuitry 1046. Motion sensor circuitry 1046 may include one or more accelerometers (e.g., accelerometers that measure acceleration along one, two, or three axes), gyroscopes, barometers, magnetic sensors (e.g., compasses), image sensors (e.g., image sensor 1044) and other sensor structures. Sensors 1046 may, for example, include one or more microelectromechanical systems (MEMS) sensors (e.g., accelerometers, gyroscopes, microphones, force sensors, pressure sensors, capacitive sensors, or any other suitable type of sensor formed using microelectromechanical systems technology).

Control circuitry 1004 may be used to store and process motion sensor data. If desired, motion sensors, processing circuitry, and storage that form motion sensor circuitry may form part of a system-on-chip integrated circuit (as an example).

Input-output devices may include movement generation circuitry. Movement generation circuitry may receive control signals from control circuitry 1004. Movement generation circuitry may include electromechanical actuator circuitry that, when driven, moves device 1000 in one or more directions. For example, movement generation circuitry may laterally move device 1000 and/or may rotate device 1000 around one or more axes of rotation. Movement generation circuitry may, for example, include one or more actuators formed at one or more locations of device 1000. When driven by a motion control signal, actuators may move (e.g., vibrate, pulse, tilt, push, pull, rotate, etc.) to cause device 1000 to move or rotate in one or more directions. The movement may be slight (e.g., not noticeable or barely noticeable to a user of device 1000), or the movement may be substantial. Actuators may be based on one or more vibrators, motors, solenoids, piezoelectric actuators, speaker coils, or any other desired device capable of mechanically (physically) moving device 1000.

Other sensors that may be included in input-output devices include ambient light sensors for gathering information on ambient light levels, proximity sensor components (e.g., light-based proximity sensors, capacitive proximity sensors, and/or proximity sensors based on other structures), depth sensors (e.g., structured light depth sensors that emit beams of light in a grid, a random dot array, or other pattern, and that have image sensors that generate depth maps based on the resulting spots of light produced on target objects), sensors that gather three-dimensional depth information using a pair of stereoscopic image sensors, LIDAR (light detection and ranging) sensors, radar sensors, and other suitable sensors.

Input-output circuitry may include wireless communications circuitry for communicating wirelessly with external equipment. Wireless communications circuitry may include radio frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 1008 may include radio-frequency transceiver circuitry for handling various radio-frequency communications bands. For example, circuitry 1008 may include transceiver circuitry.

Transceiver circuitry may be wireless local area network transceiver circuitry. Transceiver circuitry may handle 2.4 GHz and 5 GHz bands for Wi-Fi® (IEEE 802.11) communications and may handle the 2.4 GHz Bluetooth® communications band.

Circuitry may use cellular telephone transceiver circuitry for handling wireless communications in frequency ranges such as a communications band from 700 to 960 MHz, a band from 1710 to 10170 MHz, a band from 10300 to 10700 MHz, other bands between 700 and 10700 MHz, higher bands such as LTE bands 42 and 43 (3.4-3.6 GHz), or other cellular telephone communications bands. Circuitry may handle voice data and non-voice data.

Millimeter wave transceiver circuitry (sometimes referred to as extremely high frequency transceiver circuitry) may support communications at extremely high frequencies (e.g., millimeter wave frequencies such as extremely high frequencies of 10 GHz to 400 GHz or other millimeter wave frequencies). For example, circuitry may support IEEE 802.11ad communications at 60 GHz. Circuitry may be formed from one or more integrated circuits (e.g., multiple integrated circuits mounted on a common printed circuit in a system-in-package device, one or more integrated circuits mounted on different substrates, etc.).

Ultra-wideband transceiver circuitry may support communications using the IEEE 802.15.4 protocol and/or other wireless communications protocols. Ultra-wideband wireless signals may be characterized by bandwidths greater than 500 MHz or bandwidths exceeding 20% of the center frequency of radiation. The presence of lower frequencies in the baseband may allow ultra-wideband signals to penetrate through objects such as walls. Transceiver circuitry may operate in a 2.4 GHz frequency band, a 6.5 GHz frequency band, an 8 GHz frequency band, and/or at other suitable frequencies.

Wireless communications circuitry can include circuitry for other short-range and long-range wireless links if desired. For example, wireless communications circuitry 36 may include circuitry for receiving television and radio signals, paging system transceivers, near field communications (NFC) circuitry, etc.

The one or more applications 1034 on device 1000 can include any applications installed on the device 1000, including without limitation, a browser, address book, contact list, email, instant messaging, social networking, word processing, keyboard emulation, widgets, JAVA-enabled applications, encryption, digital rights management, voice recognition, voice replication, a music player (which plays back recorded music stored in one or more files, such as MP3 or advanced audio codec (AAC) files), etc.

There may be other modules or sets of instructions (not shown), such as a graphics module, a time module, etc. For example, the graphics module can include various conventional software components for rendering, animating and displaying graphical objects (including without limitation text, web pages, icons, digital images, animations, and the like) on a display surface. In another example, a timer module can be a software timer. The timer module can also be implemented in hardware. The time module can maintain various timers for any number of events.

I/O subsystem 1006 can be coupled to a display system (not shown), which can be a touch-sensitive display. The display displays visual output to the user in a GUI. The visual output can include text, graphics, video, and any combination thereof. Some or all of the visual output can correspond to user-interface objects. A display can use LED (light emitting diode), LCD (liquid crystal display) technology, or LPD (light emitting polymer display) technology, although other display technologies can be used in other embodiments.

In some embodiments, I/O subsystem 1006 can include a display and user input devices such as a keyboard, mouse, and/or trackpad. In some embodiments, I/O subsystem 1006 can include a touch-sensitive display. A touch-sensitive display can also accept input from the user based at least in part on haptic and/or tactile contact. In some embodiments, a touch-sensitive display forms a touch-sensitive surface that accepts user input. The touch-sensitive display/surface (along with any associated modules and/or sets of instructions in computer-readable medium 1002) detects contact (and any movement or release of the contact) on the touch-sensitive display and converts the detected contact into interaction with user-interface objects, such as one or more soft keys, that are displayed on the touch screen when the contact occurs. In some embodiments, a point of contact between the touch-sensitive display and the user corresponds to one or more digits of the user. The user can make contact with the touch-sensitive display using any suitable object or appendage, such as a stylus, pen, finger, and so forth. A touch-sensitive display surface can detect contact and any movement or release thereof using any suitable touch sensitivity technologies, including capacitive, resistive, infrared, and surface acoustic wave technologies, as well as other proximity sensor arrays or other elements for determining one or more points of contact with the touch-sensitive display.

Further, I/O subsystem 1006 can be coupled to one or more other physical control devices (not shown), such as pushbuttons, keys, switches, rocker buttons, dials, slider switches, sticks, LEDs, etc., for controlling or performing various functions, such as power control, speaker volume control, ring tone loudness, keyboard input, scrolling, hold, menu, screen lock, clearing and ending communications and the like. In some embodiments, in addition to the touch screen, device 1000 can include a touchpad (not shown) for activating or deactivating particular functions. In some embodiments, the touchpad is a touch-sensitive area of the device 1000 that, unlike the touch screen, does not display visual output. The touchpad can be a touch-sensitive surface that is separate from the touch-sensitive display or an extension of the touch-sensitive surface formed by the touch-sensitive display.

In some embodiments, some or all of the operations described herein can be performed using an application executing on the user's device. Circuits, logic modules, processors, and/or other components may be configured to perform various operations described herein. Those skilled in the art will appreciate that, depending on implementation, such configuration can be accomplished through design, setup, interconnection, and/or programming of the particular components and that, again depending on implementation, a configured component might or might not be reconfigurable for a different operation. For example, a programmable processor can be configured by providing suitable executable code; a dedicated logic circuit can be configured by suitably connecting logic gates and other circuit elements; and so on.

Any of the software components or functions described in this application may be implemented as software code to be executed by a processor using any suitable computer language such as, for example, Java, C, C++, C#, Objective-C, Swift, or scripting language such as Perl or Python using, for example, conventional or object-oriented techniques. The software code may be stored as a series of instructions or commands on a computer readable medium for storage and/or transmission. A suitable non-transitory computer readable medium can include random access memory (RAM), a read only memory (ROM), a magnetic medium such as a hard-drive or a floppy disk, or an optical medium, such as a compact disk (CD) or DVD (digital versatile disk), flash memory, and the like. The computer readable medium may be any combination of such storage or transmission devices.

Computer programs incorporating various features of the present disclosure may be encoded on various computer readable storage media; suitable media include magnetic disk or tape, optical storage media, such as compact disk (CD) or DVD (digital versatile disk), flash memory, and the like. Computer readable storage media encoded with the program code may be packaged with a compatible device or provided separately from other devices. In addition, program code may be encoded and transmitted via wired optical, and/or wireless networks conforming to a variety of protocols, including the Internet, thereby allowing distribution, e.g., via Internet download. Any such computer readable medium may reside on or within a single computer product (e.g., a solid-state drive, a hard drive, a CD, or an entire computer system), and may be present on or within different computer products within a system or network. A computer system may include a monitor, printer, or other suitable display for providing any of the results mentioned herein to a user.

As described above, one aspect of the present technology is the gathering, sharing, and use of data, including an authentication tag and data from which the tag is derived. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to authenticate another device, and vice versa to control which devices ranging operations may be performed. Further, other uses for personal information data that benefit the user are also contemplated by the present disclosure. For instance, health and fitness data may be shared to provide insights into a user's general wellness, or may be used as positive feedback to individuals using technology to pursue wellness goals.

Although the present disclosure has been described with respect to specific embodiments, it will be appreciated that the disclosure is intended to cover all modifications and equivalents within the scope of the following claims.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure. The use of "or" is intended to mean an "inclusive or," and not an "exclusive or" unless specifically indicated to the contrary. Reference to a "first" component does not necessarily require that a second component be provided. Moreover, reference to a "first" or a "second" component does not limit the referenced component to a particular location unless expressly stated. The term "based on" is intended to mean "based at least in part on."

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of forming a film, the method comprising:
   growing, using a deposition system, at least a portion of the film;
   analyzing, using a Reflection High-Energy Electron Diffraction (RHEED) instrument, the at least a portion of the film;
   acquiring, using a computer, one or more electron diffraction patterns from the RHEED instrument;
   determining a ratio of a first intensity of a first region of interest in the one or more electron diffraction patterns to a second intensity of a second region of interest in the one or more electron diffraction patterns, wherein the ratio is indicative of a stoichiometry of the at least a portion of the film;
   calculating, using the computer and based on the ratio, adjustments to one or more process parameters of the deposition system to control stoichiometry of the film during subsequent deposition;
   transmitting, using the computer, instructions to the deposition system to execute the adjustments to the one or more process parameters; and
   adjusting, using the deposition system, the one or more process parameters.

2. The method of claim 1 wherein the determining comprises defining the first region of interest and the second region of interest.

3. The method of claim 2 further comprising comparing the ratio to a threshold value.

4. The method of claim 1 wherein the calculating includes a machine learning algorithm that detects a change in stoichiometry of the at least a portion of the film.

5. The method of claim 1 wherein the method further comprises:
   generating a plurality of model electron diffraction patterns, selected from the one or more electron diffraction patterns, each characterized by different crystalline orientations of the at least a portion of the film and different stoichiometries of the at least a portion of the film; and
   comparing the ratio to a plurality of ratios associated with the plurality of model electron diffraction patterns.

6. The method of claim 1 wherein the calculating comprises recording an intensity of a region of the one or more electron diffraction patterns during the growing of the at least a portion of the film and determining a period of oscillations in the intensity.

7. The method of claim 1 wherein the calculating comprises recording an intensity of a region of the one or more electron diffraction patterns during the growing of at least a portion of the film and determining an amplitude of oscillations in the intensity.

8. The method of claim 1 wherein the film comprises barium, titanium and oxygen.

9. The method of claim 1 wherein the film comprises at least one of $BaTiO_3$, $(Ba, Sr)TiO_3$, $(Ba, Ca)TiO_3$, or $(Ba, Mg)TiO_3$.

10. The method of claim 1 wherein the one or more electron diffraction patterns from the RHEED instrument comprise electron diffraction patterns from at least two different crystalline orientations.

11. A system for forming a film, the system comprising:
   a deposition system including one or more cells configured to deposit a film on a substrate using one or more process control parameters;
   a Reflection High-Energy Electron Diffraction (RHEED) instrument integrated with the deposition system and configured to acquire one or more electron diffraction patterns during the depositing; and
   a computer configured to:
      determine a ratio of a first intensity of a first region of interest in the one or more electron diffraction patterns to a second intensity of a second region of interest in the one or more electron diffraction patterns, wherein the ratio is indicative of a stoichiometry of a growth surface of the film;
      calculate, based on the ratio, adjustments to the one or more process control parameters; and
      transmit instructions to the deposition system to adjust at least one of the one or more process control parameters during the depositing.

12. The system of claim 11 wherein the one or more process control parameters control the stoichiometry of the film.

13. The system of claim 11 wherein the determining comprises defining the first region of interest and the second region of interest.

14. The system of claim 13 wherein the computer is further configured to compare the ratio to a threshold value.

15. The system of claim 11 wherein the calculating includes use of a machine learning algorithm that detects a change in stoichiometry during the depositing.

16. The system of claim 11 wherein the computer generate a plurality of model electron diffraction patterns, selected from the one or more electron diffraction patterns, each characterized by different crystalline orientations of the at least a portion of the film and different stoichiometries of the at least a portion of the film.

17. The system of claim 16 wherein the computer compares the ratio to a plurality of ratios, each associated with one of the plurality of model electron diffraction patterns.

18. The system of claim 11 wherein each of the first region of interest and the second region of interest is defined to encompass at least a portion of a feature that increases in intensity in the one or more electron diffraction patterns in response to a change in stoichiometry of the film.

19. The system of claim 11 wherein the film comprises barium, titanium and oxygen.

20. The system of claim 11 wherein the film comprises at least one of:
   strontium, titanium and oxygen;
   barium, strontium, titanium and oxygen;
   barium, magnesium, titanium and oxygen; or
   barium, calcium, titanium and oxygen.

* * * * *